(12) United States Patent
Danno et al.

(10) Patent No.: US 10,546,933 B2
(45) Date of Patent: Jan. 28, 2020

(54) SWITCHING ELEMENT AND METHOD OF MANUFACTURING THE SAME

(71) Applicant: TOYOTA JIDOSHA KABUSHIKI KAISHA, Toyota-shi, Aichi-ken (JP)

(72) Inventors: Katsunori Danno, Obu (JP); Kensaku Yamamoto, Kariya (JP); Yusuke Yamashita, Nagakute (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/189,462

(22) Filed: Nov. 13, 2018

(65) Prior Publication Data
US 2019/0148497 A1 May 16, 2019

(30) Foreign Application Priority Data

Nov. 14, 2017 (JP) .................................. 2017-219372

(51) Int. Cl.
| | |
|---|---|
| H01L 29/15 | (2006.01) |
| H01L 29/16 | (2006.01) |
| H01L 29/78 | (2006.01) |
| H01L 29/66 | (2006.01) |
| H01L 29/10 | (2006.01) |
| H01L 29/08 | (2006.01) |
| H01L 29/423 | (2006.01) |

(52) U.S. Cl.
CPC ...... *H01L 29/1608* (2013.01); *H01L 29/0865* (2013.01); *H01L 29/1095* (2013.01); *H01L 29/4236* (2013.01); *H01L 29/66734* (2013.01); *H01L 29/7813* (2013.01)

(58) Field of Classification Search
CPC ............. H01L 29/1608; H01L 29/0865; H01L 29/1095; H01L 29/4236; H01L 29/66734; H01L 29/7813
USPC ........................................................ 257/77
See application file for complete search history.

(56) References Cited

U.S. PATENT DOCUMENTS

| | | | |
|---|---|---|---|
| 2016/0003889 A1 | 1/2016 | Watanabe et al. | |
| 2016/0104794 A1 | 4/2016 | Takeuchi et al. | |
| (Continued) | | | |

FOREIGN PATENT DOCUMENTS

| | | | |
|---|---|---|---|
| JP | 2013232574 A | 11/2013 | |
| JP | 2015002277 A | 1/2015 | |
| JP | 6048317 B2 | 12/2016 | |
| (Continued) | | | |

*Primary Examiner* — Tan N Tran
(74) *Attorney, Agent, or Firm* — Hunton Andrews Kurth LLP

(57) ABSTRACT

A switching element may include a SiC substrate including an off-angle; a trench provided in an upper surface of the SiC substrate and extending along an off-direction of the SiC substrate in a plan view of the upper surface; a gate insulating film; and a gate electrode. The SiC substrate may include a source region of n-type; a contact region of p-type; a body region of p-type being in contact with the gate insulating film below the source region; a drift region of n-type being in contact with the gate insulating film below the body region; and low lifetime regions located in a range between the drift region and at least one of the source region and the contact region. The low lifetime regions may be arranged along the off-direction with intervals, and at least a part of the body region may be provided in the intervals.

10 Claims, 13 Drawing Sheets

(56) References Cited

U.S. PATENT DOCUMENTS

2017/0025524 A1    1/2017  Kinoshita et al.
2018/0358429 A1*  12/2018  Tanaka .................. H01L 21/047

FOREIGN PATENT DOCUMENTS

| JP | 6104363 B2 | 3/2017 |
| JP | 6402773 B2 | 10/2018 |

* cited by examiner

SWITCHING ELEMENT AND METHOD OF MANUFACTURING THE SAME

CROSS-REFERENCE TO RELATED APPLICATION

The present application claims priority to Japanese Patent Application No. 2017-219372 filed on Nov. 14, 2017, which is incorporated herein by reference in its entirety.

TECHNICAL FIELD

The technique disclosed herein relates to a switching element and a method of manufacturing the same.

BACKGROUND

Japanese Patent Application Publication No. 2015-002277 describes a switching element provided with a SiC substrate. The SiC substrate includes an off-angle. Basal plane dislocation (BPD) exists within the SiC substrate. When current flows in the SiC substrate, carriers recombine within the SiC substrate. Plane defects grow with the basal plane dislocation as their starting points by recombination energy generated upon the recombination. The plane defects grow along a $\{0001\}$ plane. When the plane defects grow, a resistance of the SiC substrate increases, and a loss generated in the switching element increases.

The switching element of Japanese Patent Application Publication No. 2015-002277 is provided with a plurality of current restricting regions located inside a drift layer. The current restricting regions are constituted of p-type layers. The plurality of current restricting regions is arranged dispersedly within the drift layer. When the plane defects grow in the drift layer, the plane defects reach the current restricting regions. Recombination energy supply to the plane defects is suppressed in the current restricting regions. Due to this, growth of the plane defects stops. Accordingly, the plane defects are suppressed from excessively growing.

SUMMARY

In the technique of Japanese Patent Application Publication No. 2015-002277, the growth of the plane defects in the drift layer is suppressed. On the other hand, the growth of the plane defects occurs also in a body region. Thus, the disclosure herein proposes a technique which suppresses growth of plane defects in a body region.

A switching element disclosed herein may comprise a SiC substrate including an off-angle; a trench provided in an upper surface of the SiC substrate and extending along an off-direction of the SiC substrate in a plan view of the upper surface; a gate insulating film covering an inner surface of the trench; and a gate electrode provided in the trench and insulated from the SiC substrate by the gate insulating film. The SiC substrate may comprise a source region of n-type disposed at the upper surface and being in contact with the gate insulating film; a contact region of p-type disposed at the upper surface at a position adjacent to the source region; a body region of p-type being in contact with the gate insulating film below the source region, connected to the contact region directly or via another p-type region, and having a p-type impurity density lower than a p-type impurity density of the contact region; a drift region of n-type being in contact with the gate insulating film below the body region; and a plurality of low lifetime regions located in a range between the drift region and at least one of the source region and the contact region, and having a point defect density higher than a point defect density in portions of the body region around the low life time regions. The low lifetime regions may be arranged along the off-direction with intervals. At least a part of the body region may be provided in the intervals.

In the disclosure herein, point defects include atomic vacancies, interstitial atoms, impurity atoms displaced to lattice sites, and the like. Thus, the low lifetime regions may be regions where a density of the atomic vacancies or the interstitial atoms is high, or may be regions where a p-type impurity density or an n-type impurity density is high (that is, regions where a density of impurity atoms displaced to the lattice sites is high).

In this switching element, current can flow from the contact region to the drift region through the body region. That is, a diode is configured by the contact region, the body region, and the drift region. When the current flows in the diode, plane defects grow with basal plane dislocation in the body region as their starting point. The plane defects grow along a $\{0001\}$ plane. Due to this, the plane defects grow along the off-direction (direction along which the trench extends). Further, in this switching element, the plurality of low lifetime regions is arranged along the off-direction with the intervals therebetween, and at least a part of the body region is arranged in each interval. Most of the plane defects generated in the body region in the intervals reach the low lifetime regions as they grow along the off-direction. Carriers easily recombine at the point defects in the low lifetime regions having the high point defect density, and carrier lifetime is thereby short. Due to this, the recombination occurs at the point defects in the low lifetime regions, and the recombination occurs less at the plane defects. Due to this, a recombination energy supply to the plane defects is suppressed in the low lifetime regions, and growth of the plane defects thereby stops. Due to this, the plane defects are prevented from growing excessively. Further, the low lifetime regions have a high resistance, however, the current can flow through the body region in the intervals. Due to this, a loss generated upon when the current flows in the diode is small despite having the low lifetime regions arranged.

DETAILED DESCRIPTION

Figure 1:
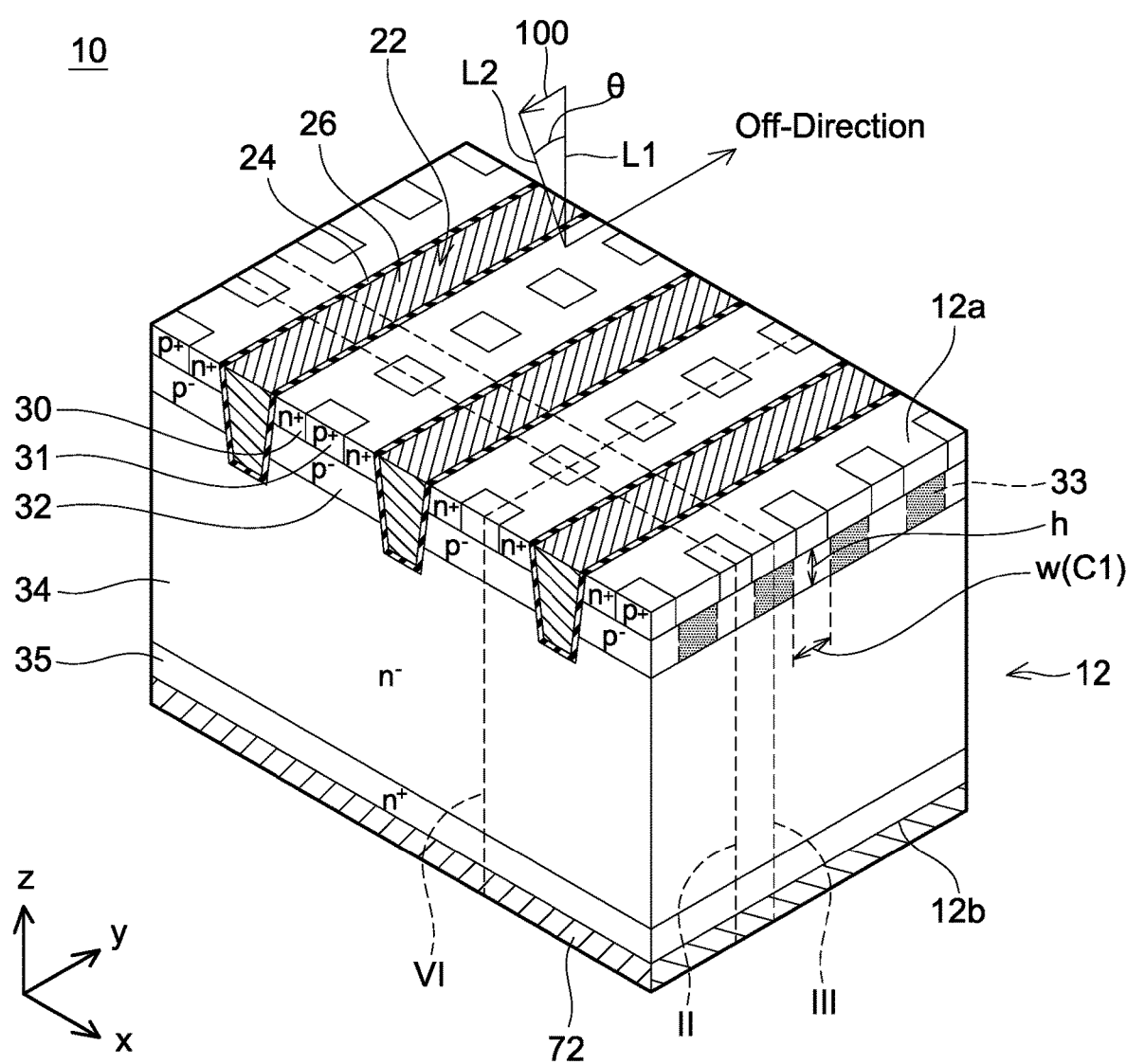
FIG. 1 is a perspective view of a switching element of an embodiment.
Figure 2:
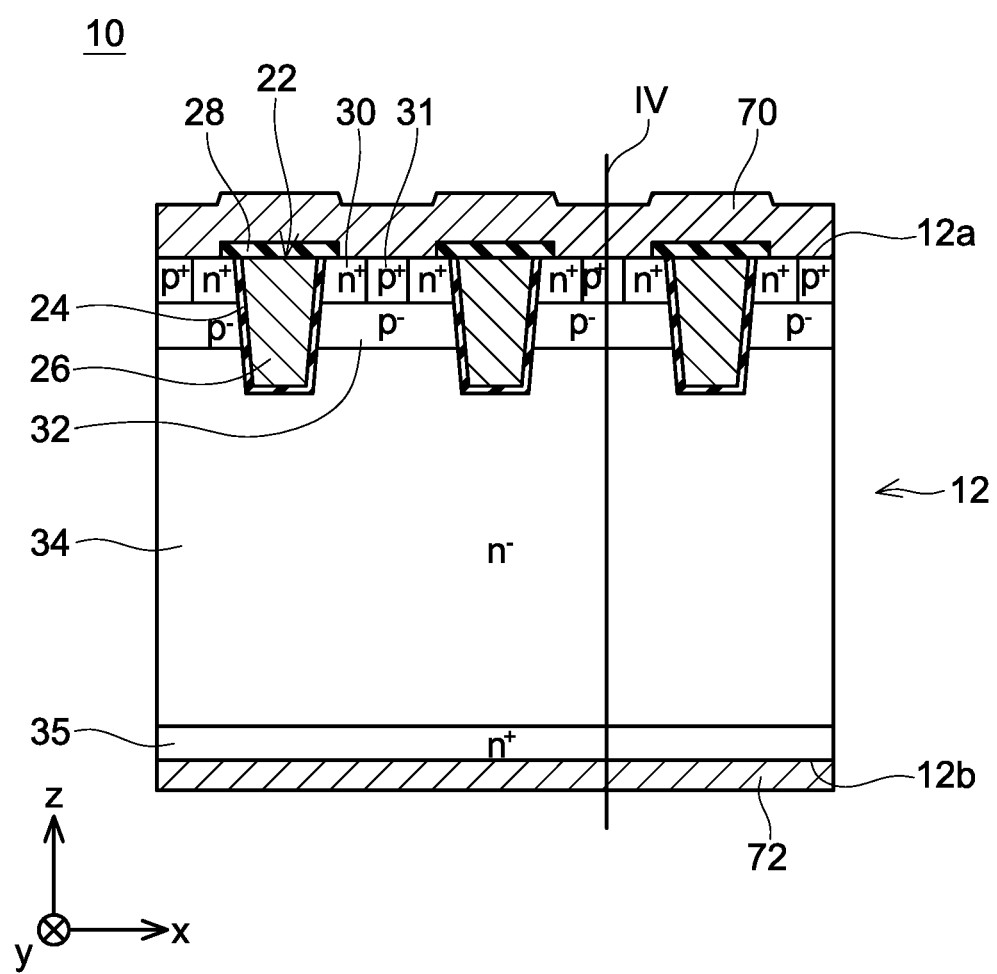
FIG. 2 is a cross-sectional view of a plane II in FIG. 1.
Figure 3:
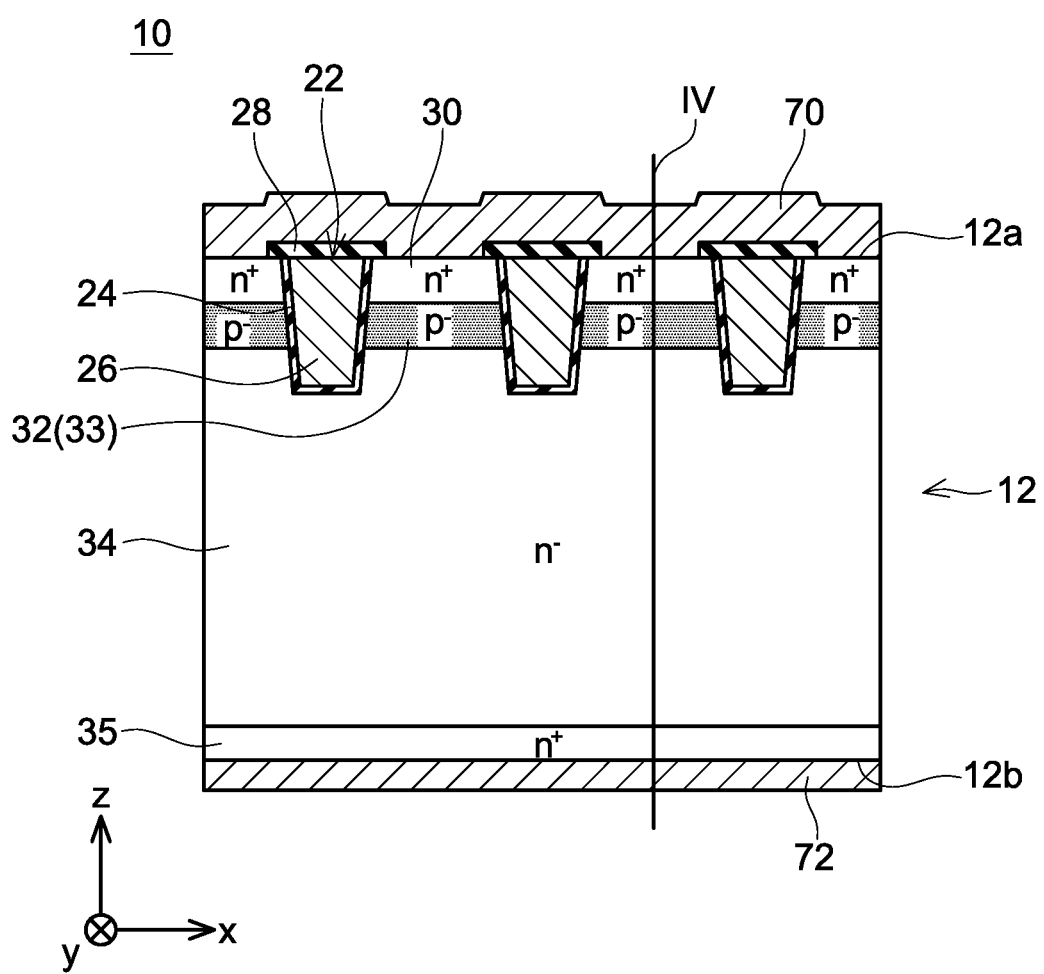
FIG. 3 is a cross-sectional view of a plane III in FIG. 1.
Figure 4:
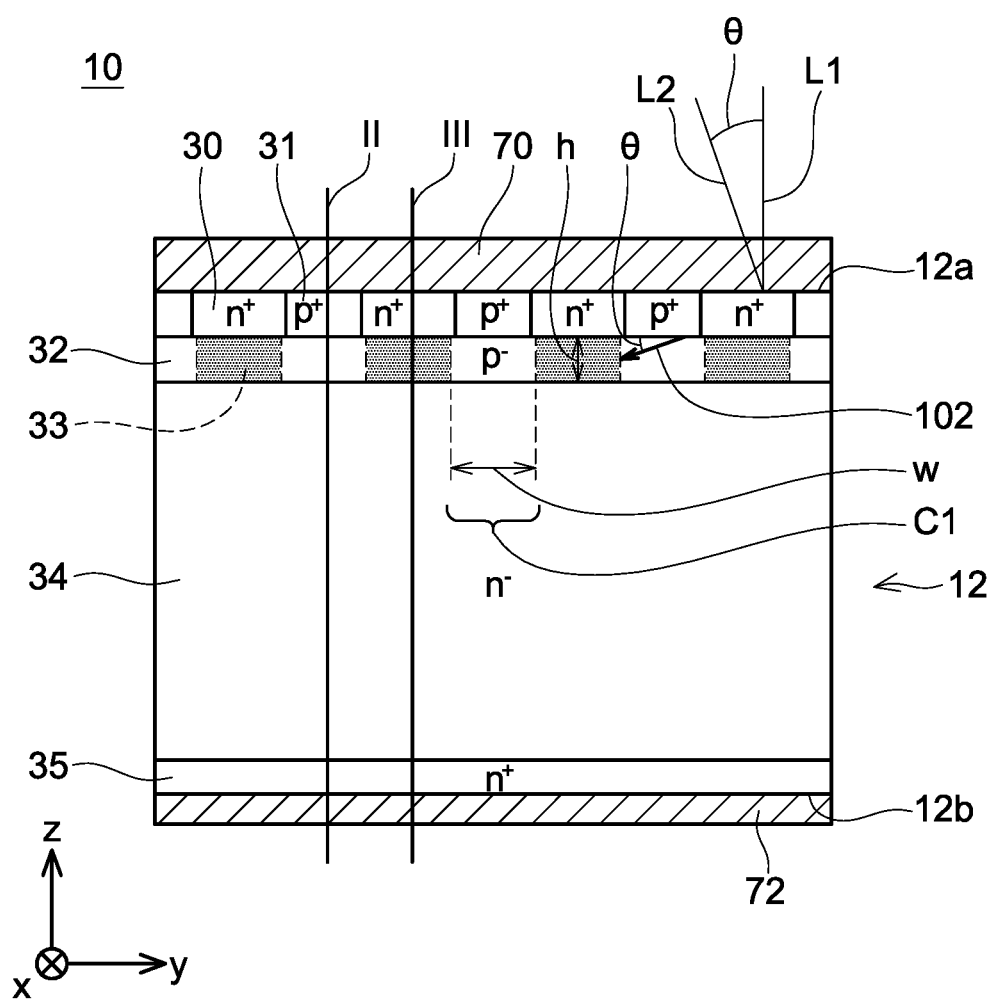
FIG. 4 is a cross-sectional view of a plane IV in FIG. 1.

FIGS. 1 to 4 show a switching element 10 of an embodiment. Hereinbelow, one direction parallel to an upper surface 12a of a SiC substrate 12 will be termed an x direction, a direction parallel to the upper surface 12a and perpendicularly intersecting the x direction will be termed a y direction, and a thickness direction of the SiC substrate 12 will be termed a z direction. FIG. 2 is a cross-sectional view along a plane II in FIG. 1, FIG. 3 is a cross-sectional view along a plane III in FIG. 1, and FIG. 4 is a cross-sectional view along a plane IV in FIG. 1. As shown in FIGS. 2 to 4, electrodes, insulating layers, and the like are provided on the upper surface 12a of the SiC substrate 12. In FIG. 1, depiction of the electrodes, the insulating layers, and the like on the upper surface 12a of the SiC substrate 12 is omitted for easier understanding.

The SiC substrate 12 is constituted of 4H-SiC. A line L1 in FIG. 1 indicates a perpendicular line of the upper surface 12a. Further, a line L2 in FIG. 1 indicates a C axis (that is, <0001> axis) of SiC crystal constituting the SiC substrate 12. An angle θ in FIG. 1 indicates an off-angle of the SiC substrate 12 (that is, a tilt angle of the C axis L2 relative to the perpendicular line L1). The C axis L2 is tilted relative to the perpendicular line L about an x axis. That is, a C plane of the SiC crystal (that is, {0001} plane) is tilted about the x axis relative to the upper surface 12a of the SiC substrate 12. Thus, when the upper surface 12a is seen in a plan view along the perpendicular line L1, the C axis L2 extends along the y direction as shown by an arrow 100 in FIG. 1. Due to this, an off-direction is a direction parallel to the arrow 100 when the upper surface 12a is seen in the plan view along the perpendicular line L1. In this embodiment, the off-direction is <11-20> direction.

As shown in FIG. 1, a plurality of trenches 22 is provided in the upper surface 12a of the SiC substrate 12. The plurality of trenches 22 extends parallel to each other in the upper surface 12a. The plurality of trenches 22 extends linearly with its longitudinal direction along the y direction in the upper surface 12a. The plurality of trenches 22 is arranged with intervals therebetween in the x direction. A gate insulating film 24 and a gate electrode 26 are arranged inside each of the trenches 22.

As shown in FIGS. 1 to 4, each of the gate insulating films 24 covers an inner surface of corresponding one of the trenches 22. The gate insulating films 24 are constituted of silicon oxide. Each of the gate electrodes 26 is insulated from the SiC substrate 12 by its corresponding gate insulating film 24. As shown in FIGS. 2 and 3, upper surfaces of the gate electrodes 26 are covered by interlayer insulating films 28.

As shown in FIGS. 2 to 4, an upper electrode 70 is provided on the upper surface 12a of the SiC substrate 12. The upper electrode 70 covers the upper surface 12a and the interlayer insulating films 28. The upper electrode 70 is in contact with the upper surface 12a of the SiC substrate 12 at portions where the interlayer insulating films 28 are not provided. The upper electrode 70 is insulated from the gate electrodes 26 by the interlayer insulating films 28. A lower electrode 72 is provided on a lower surface 12b of the SiC substrate 12. The lower electrode 72 is in contact with the lower surface 12b of the SiC substrate 12.

As shown in FIGS. 1 to 4, a source region 30, a plurality of contact regions 31, a body region 32, a plurality of low lifetime regions 33, a drift region 34, and a drain region 35 are provided inside the SiC substrate 12.

The source region 30 is an n-type region. The source region 30 is disposed at the upper surface 12a in each semiconductor region interposed between two adjacent trenches 22 (which may hereinbelow be termed an inter-trench region). The source region 30 is in ohmic contact with the upper electrode 70. The source region 30 is in contact with the gate insulating films 24 at upper end portions of the respective trenches 22. The source region 30 faces the respective gate electrodes 26 via the gate insulating films 24.

Each of the contact regions 31 is a p-type region having a high p-type impurity density. A plurality of contact regions 31 is arranged in each of the inter-trench regions. Each of the contact regions 31 is disposed at the upper surface 12a. Each of the contact regions 31 is in ohmic contact with the upper electrode 70. Each of the contact regions 31 is arranged at a position separated from the trenches 22 (that is, the gate insulating films 24). In each of the inter-trench regions, the plurality of contact regions 31 is arranged along the y direction with intervals therebetween. In the upper surface 12a, a periphery of each contact region 31 is surrounded by the source region 30.

The body region 32 is a p-type region having a lower p-type impurity density than the respective contact regions 31. The body region 32 is arranged below the source region 30 and the contact regions 31. In FIGS. 1 to 4, hatched regions in the body region 32 are the low lifetime regions 33. In this embodiment, the low lifetime regions 33 are a part of the body region 32. The body region 32 contacts the source region 30 and the respective contact regions 31 from below. The body region 32 is distributed over an entire region below the source region 30 and the respective contact regions 31. Due to this, the source region 30 and the respective contact regions 31 are separated from the drift region 34 by the body region 32. The body region 32 contacts the gate insulating films 24 below the source region 30. The body region 32 faces the gate electrodes 26 via the gate insulating films 24. A lower end of the body region 32 is located above lower ends of the gate electrodes 26.

The drift region 34 is an n-type region having a low n-type impurity density. As shown in FIGS. 1 to 4, the drift region 34 is arranged below the body region 32. The drift region 34 contacts the body region 32 from below. The drift region 34 contacts the gate insulating films 24 below the body region 32. The drift region 34 faces the gate electrodes 26 via the gate insulating films 24.

The drain region 35 is an n-type region having a higher n-type impurity density than the drift region 34. As shown in FIGS. 1 to 4, the drain region 35 is arranged below the drift region 34. The drain region 35 contacts the drift region 34 from below. The drain region 35 is provided in a range disposed at the lower surface 12b of the SiC substrate 12, and is in ohmic contact with the lower electrode 72.

Each of the low lifetime regions 33 is provided in the body region 32. The low lifetime regions 33 are regions of which point defect density has been increased by ion implantation. The point defect density of each low lifetime region 33 is higher than a point defect density in the body region 32 outside the low lifetime regions 33. That is, the low lifetime regions 33 are regions constituted by a part of the body region 32, and are regions having higher point defect density than the body region 32 surrounding them.

Point defects serve as recombination centers of carriers. Thus, carrier lifetime is short in the low lifetime regions 33. As shown in FIGS. 1 and 4, the plurality of low lifetime regions 33 is arranged with intervals C1 therebetween in the y direction within the body region 32 in each of the inter-trench regions. The body region 32 having the low point defect density (the body region 32 outside the low lifetime regions 33) is arranged in each interval C1. A width w of the intervals C1 in the y direction, a thickness h of the low lifetime regions 33 (dimension along the z direction), and the off-angle θ satisfy a relationship of w<h/tan θ. As shown in FIG. 3, each of the low lifetime regions 33 extends from one of two adjacent trenches 22 arranged on both sides of its corresponding inter-trench region to the other thereof.

Inside the switching element 10, a MOSFET is constituted of the source region 30, the body region 32, the drift region 34, the drain region 35, the gate electrodes 26 and the like. Further, inside the switching element 10, a pn diode is constituted of the plurality of contact regions 31, the body region 32, the drift region 34, the drain region 35, and the like.

Next, an operation of the MOSFET will be described. A voltage in a direction which makes the lower electrode 72 have a higher potential than the upper electrode 70 (hereafter termed a first voltage) can be applied to the switching element 10. Further, when a gate-on potential (potential equal to or greater than a gate threshold) is applied to the gate electrodes 26, channels are formed in the body region 32 in vicinities of the gate insulating films 24. The channels connect the source region 30 and the drift region 34. When the channels are formed in a state where the first voltage is applied, electrons flow from the upper electrode 70 to the lower electrode 72 through the source region 30, the channels, the drift region 34, and the drain region 35. That is, the MOSFET is turned on. When the potential of the gate electrodes 26 is brought down to a gate-off potential (potential less than the gate threshold), the channels vanish, and the electrons stop flowing. That is, the MOSFET is turned off.

Further, a voltage in a direction which makes the upper electrode 70 have a higher potential than the lower electrode 72 (hereafter termed a second voltage) can be applied to the switching element 10. In this case, holes flow from the upper electrode 70 to the lower electrode 72 through the contact regions 31, the body region 32, the drift region 34, and the drain region 35. Concurrently, electrons flow from the lower electrode 72 to the upper electrode 70 through the drain region 35, the drift region 34, the body region 32, and the contact regions 31. That is, the pn diode is turned on.

Basal plane dislocation exists at a constant density in the SiC substrate 12. When the pn diode is turned on, a part of the electrons and holes flowing in the SiC substrate 12 recombines in the body region 32. When this happens, recombination energy is supplied to the basal plane dislocation existing in the body region 32, and plane defects grow with the basal plane dislocation as their starting points. Since the plane defects serve as resistance elements, the growth of the plane defects increases resistance of the SiC substrate 12. Further, when the plane defects in the body region 32 reach the drift region 34, characteristics of the pn diode deteriorate. However, in the switching element 10 of the present embodiment, the growth of the plane defects is suppressed by the low lifetime regions 33. Hereinbelow, this feature will be described in detail.

The plurality of low lifetime regions 33 is arranged with intervals C1 therebetween in the y direction in the body region 32. The point defects serve as the recombination centers for the holes and electrons. Due to this, the recombination occurs at the point defects in the low lifetime regions 33 having the high point defect density, and the recombination occurs less at the basal plane dislocation. Thus, the plane defects hardly occur within the low lifetime regions 33. Further, since the point defect density is low in the body region 32 in each of the intervals C1, the plane defects grow from the basal plane dislocation. The plane defects that grow with the basal plane dislocation as their starting points grow along the C plane. In the present embodiment, since the C axis L2 is tilted relative to the perpendicular line L about the x axis, the C plane is tilted relative to the upper surface 12a about the x axis. An arrow 102 in FIG. 4 indicates a direction of the C plane. The plane defects grow substantially parallel to the arrow 102 primarily along the y direction. As shown by the arrow 102, when the plane defects grow along the y direction in the intervals C1, most of the plane defects reach the low lifetime regions 33. As mentioned above, since the recombination occurs at the point defects in the low lifetime regions 33, the recombination occurs less at the plane defects. Thus, the growth of the plane defects stops in the low lifetime regions 33. Due to this, the growth of the plane defects generated in the intervals C1 is suppressed. Accordingly, the SiC substrate 12 can be suppressed from exhibiting high resistance.

Especially in the present embodiment, the width w of the intervals C1, the thickness h of the low lifetime regions 33, and the off-angle θ satisfy the relationship of w<h/tan θ. Due to this, the plane defects that grow along the C plane with an upper end of the body region 32 in the intervals C1 as their starting points reach the low lifetime regions 33. Due to this, such plane defects can be prevented from reaching the drift region 34. Accordingly, the deterioration of the characteristics of the pn diode can be suppressed.

Further, resistivity of the low lifetime regions 33 having the high point defect density is high. However, in the switching element 10, the plurality of low lifetime regions 33 is arranged with intervals C1 therebetween in the y direction, and the body region 32 having the low point defect density is arranged in each of the intervals C1. Thus, when the pn diode is turned on, electrons and holes can flow in the body region 32 in the intervals C1 at low losses. Thus, according to the switching element 10, the loss generated upon electric conduction of the pn diode can be suppressed despite having the low lifetime regions 33.

Figure 5:
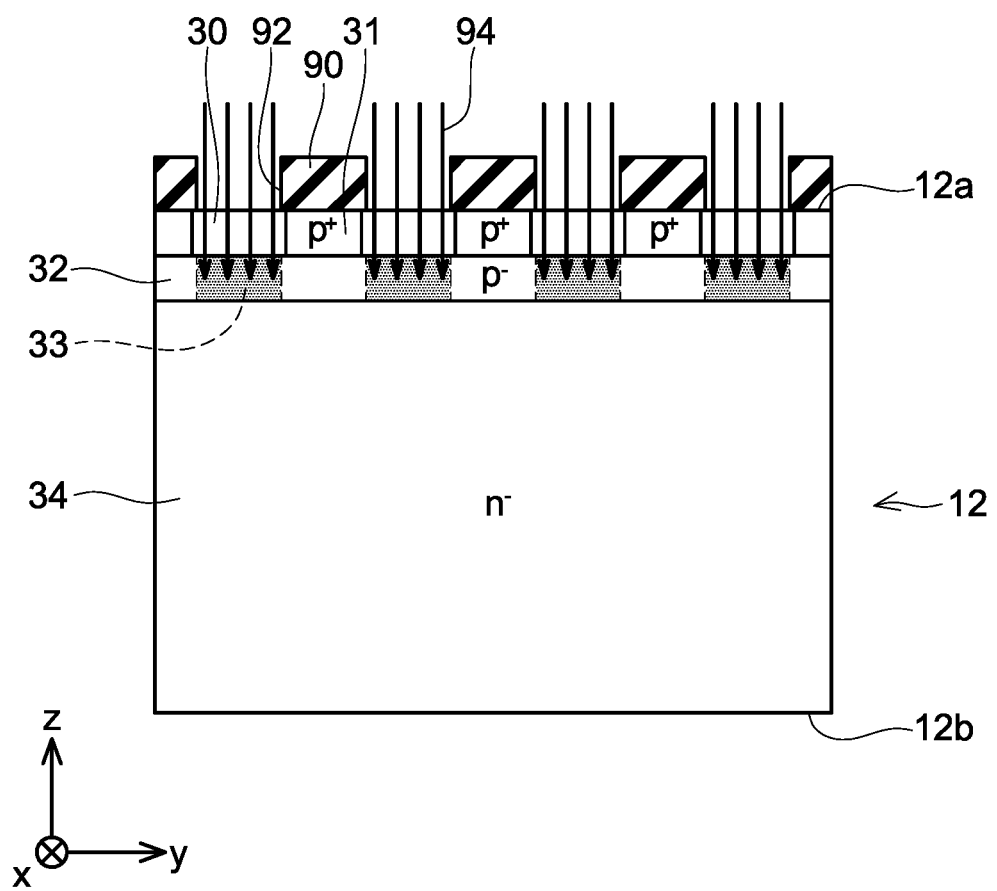
FIG. 5 is an explanatory diagram of a process of forming low lifetime regions.

FIG. 5 shows a process of forming the low lifetime regions 33. As shown in FIG. 5, a mask 90 including openings 92 is provided on the upper surface 12a, and nonpolar charged particles 94 (charged particles that are not p-type impurities nor n-type impurities), such as vanadium ions, helium ions, and deuterium, are implanted selectively in the body region 32 via the mask 90. By so doing, the point defects are formed at a high density in each range where the charged particles 94 were implanted, and the low lifetime regions 33 are thereby formed in the body region 32. According to this process, the aforementioned low lifetime regions 33 can suitably be formed.

Figure 6:
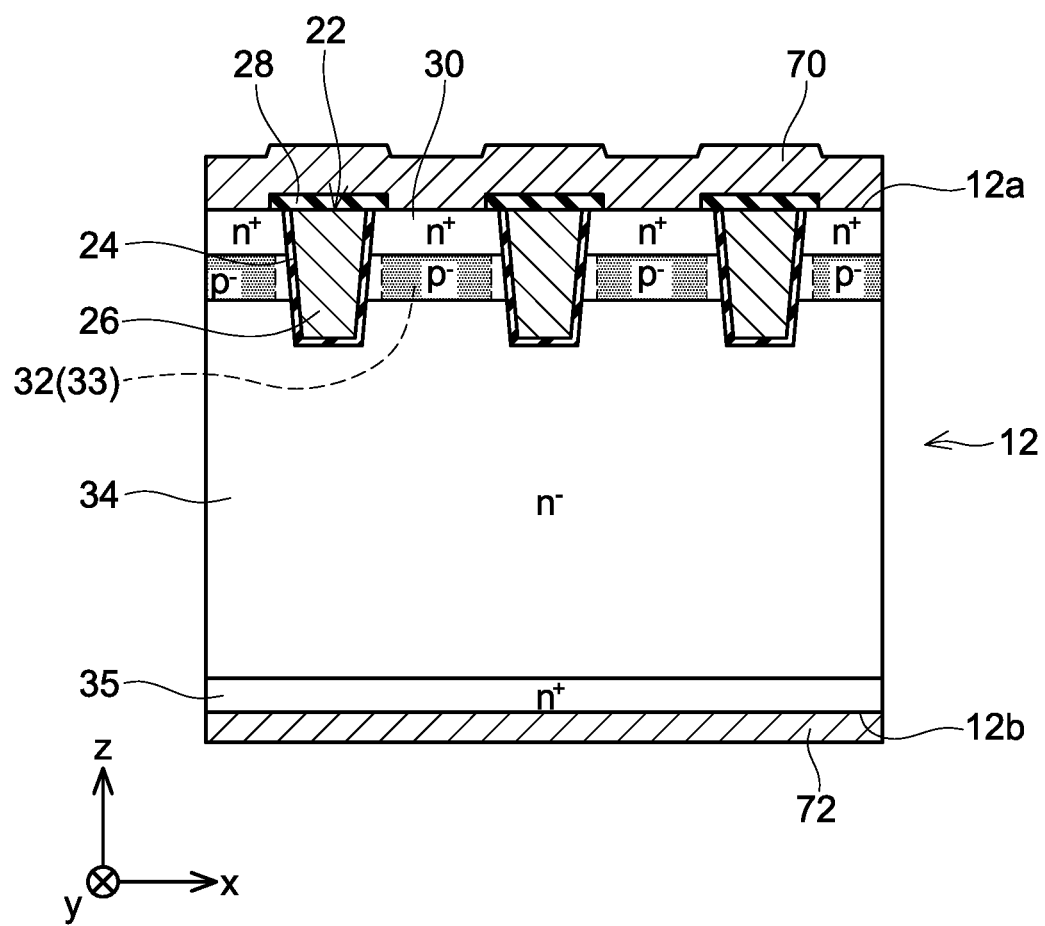
FIG. 6 is a cross-sectional view showing an example of an arrangement of the low lifetime regions (cross-section of the plane III).

In the aforementioned embodiment, as shown in FIG. 3, the low lifetime regions 33 are distributed to positions at which they can be adjacent to the gate insulating films 24. In this configuration, a large number of point defects exist in ranges where the channels are to be formed (in the body region 32 in the vicinities of the gate insulating films 24) in the cross-section shown in FIG. 3. Due to this, electrons are inhibited from moving in the channels by the point defects. Thus, in the cross-section shown in FIG. 3, mobility in the channels becomes low. Due to this, when the MOSFET is turned on, majority of the electrons flow through the channels formed along the cross-section of FIG. 2 and the current is thereby accumulated. Thus, as shown in FIG. 6, the low lifetime regions 33 may be separated from the gate insulating films 24. According to this configuration, the point defect density becomes low over entireties of the channels, so the local current accumulation can be suppressed.

Figure 7:
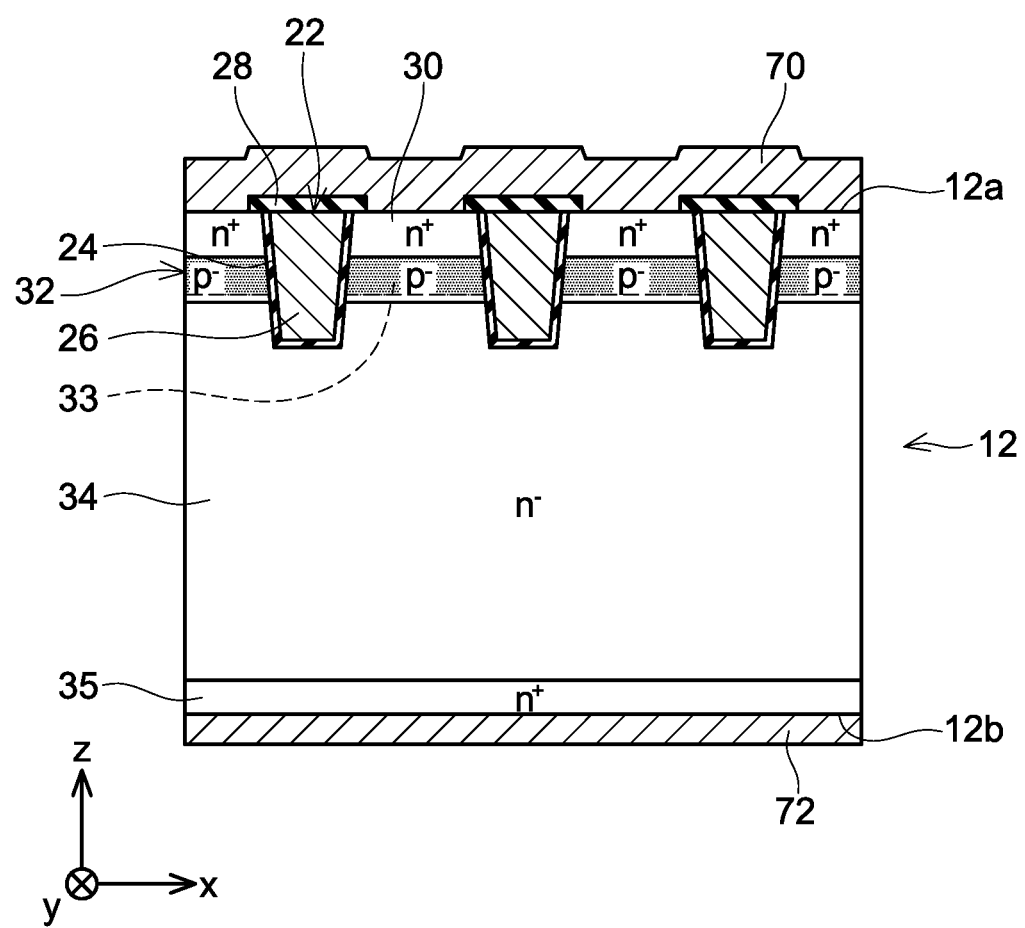
FIG. 7 is a cross-sectional view showing an example of the arrangement of the low lifetime regions (cross-sectional view of the plane III).

Further, in the aforementioned embodiment, as shown in FIG. 3, lower ends of the low lifetime regions 33 substantially match the lower end of the body region 32. However, as shown in FIG. 7, the lower ends of the low lifetime regions 33 may be located above the lower end of the body region 32. Further, the lower ends of the low lifetime regions 33 may be located below the lower end of the body region 32. However, in the case where the lower ends of the low lifetime regions 33 are located below the lower end of the body region 32, the low lifetime regions 33 protrude into the drift region 34, so a problem that an electric field is applied to the lower ends of the low lifetime regions 33 may arise. Thus, as shown in FIGS. 3 and 7, the low lifetime regions 33 may not protrude downward relative to the body region 32.

Figure 8:
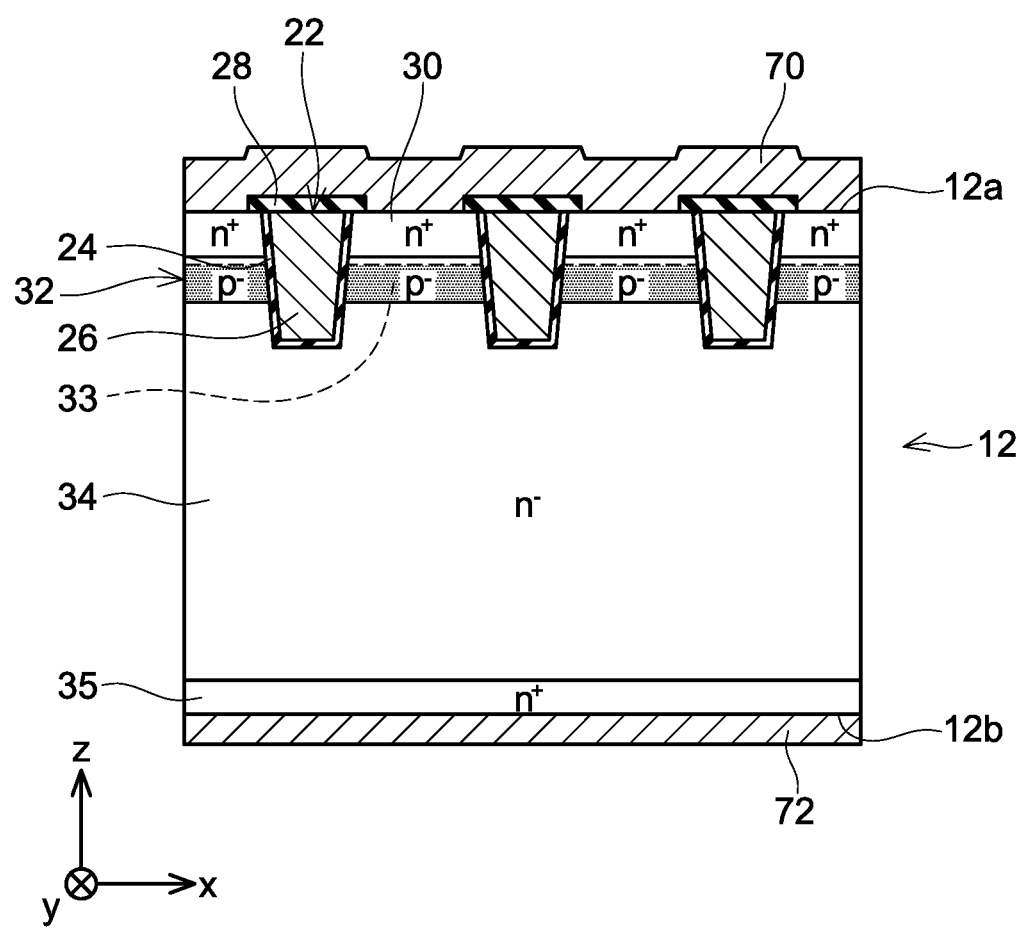
FIG. 8 is a cross-sectional view showing an example of the arrangement of the low lifetime regions (cross-sectional view of the plane III).

Further, in the aforementioned embodiment, as shown in FIG. 3, upper ends of the low lifetime regions 33 extend to the lower ends of the contact regions 31. However, as shown in FIG. 8, the upper ends of the low lifetime regions 33 may be located below the lower ends of the contact regions 31. In the configuration of FIG. 8 as well, the growth of the plane defects can be suppressed similarly to the aforementioned embodiment.

Figure 9:
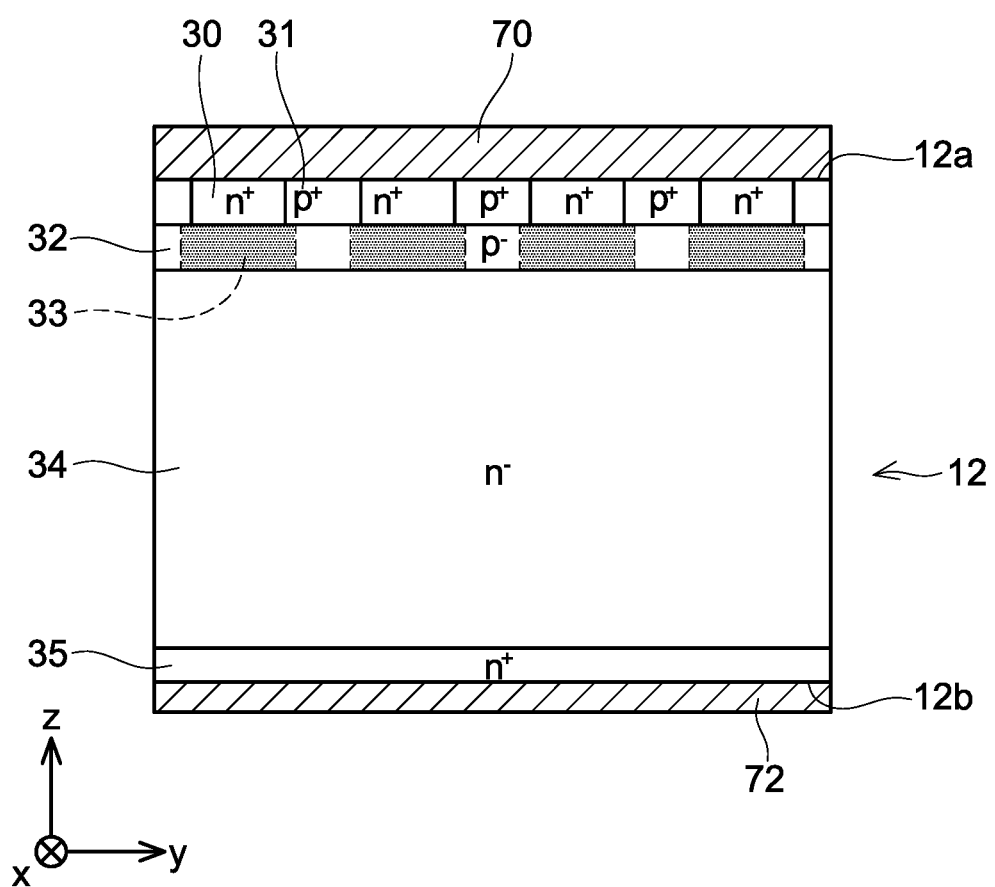
FIG. 9 is a cross-sectional view showing an example of the arrangement of the low lifetime regions (cross-sectional view of the plane IV).
Figure 10:
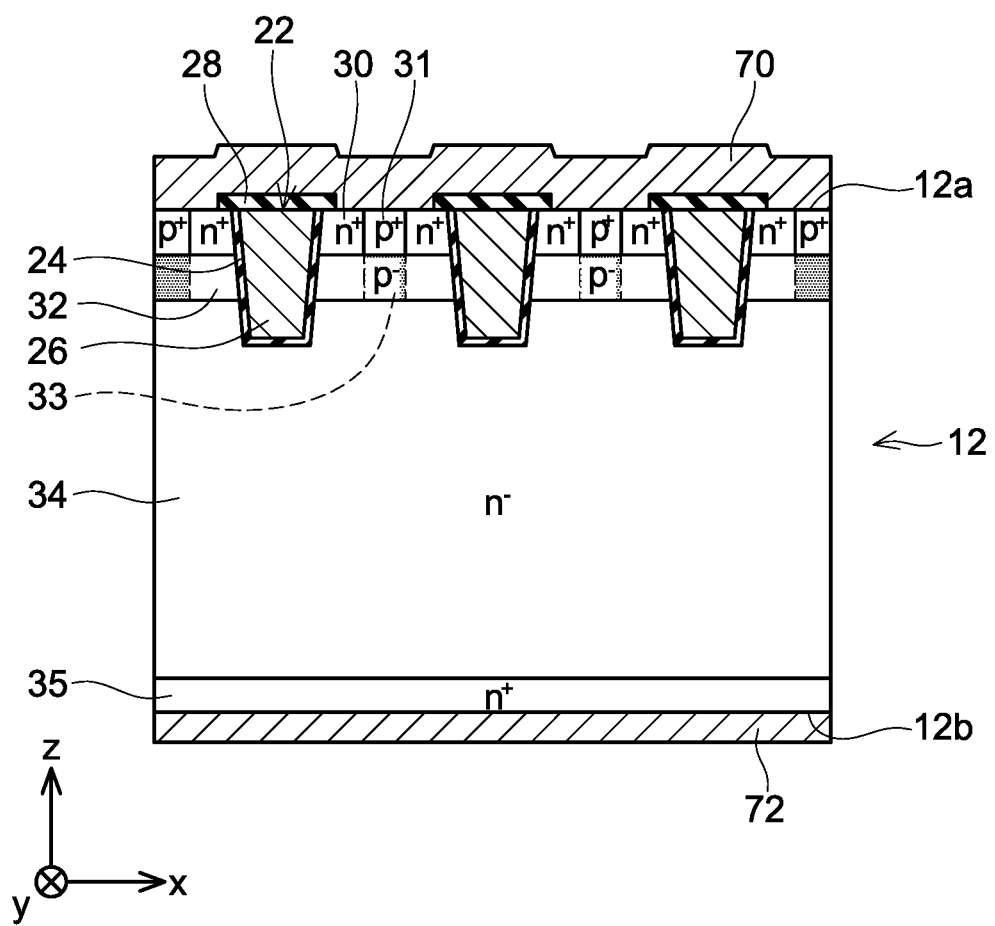
FIG. 10 is a cross-sectional view showing an example of the arrangement of the low lifetime regions (cross-sectional view of the plane II).

Further, in the aforementioned embodiment, as shown in FIGS. 1 and 4, the low lifetime regions 33 are provided below the source region 30 and are not provided below the contact regions 31. However, as shown in FIG. 9, each of the low lifetime regions 33 may extend in a range from a position under the source region 30 to a position under one or more contact regions 31. Further, as shown in FIG. 10, the low lifetime regions 33 may be provided under the contact regions 31 and may not be provided under the source region 30. The growth of the plane defects can be suppressed in both configurations of FIGS. 9 and 10, similarly to the aforementioned embodiment.

Figure 11:
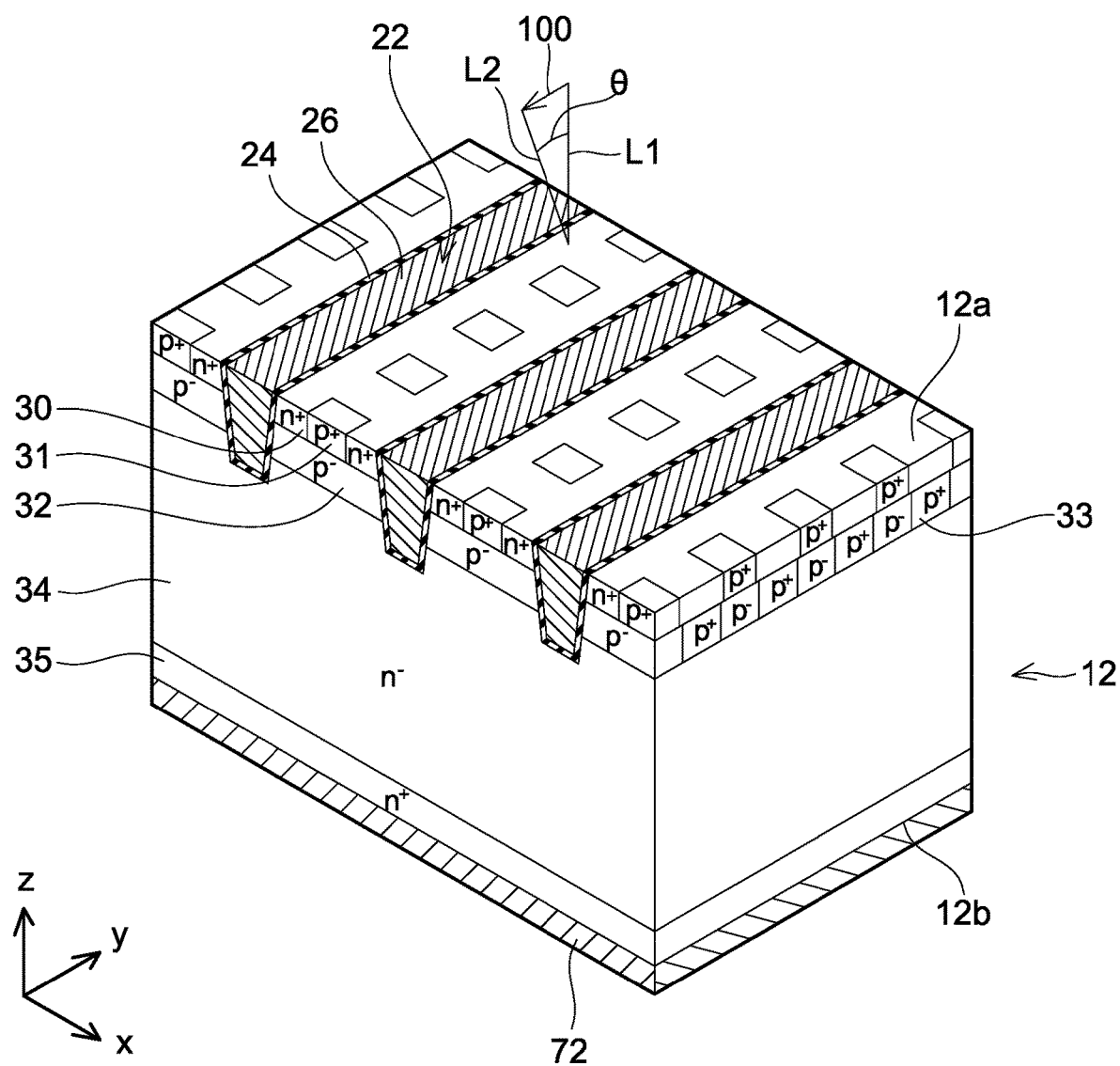
FIG. 11 is a diagram showing the low lifetime regions constituted of high-density p-type regions.

Further, in the aforementioned embodiment, the low lifetime regions 33 are constituted of the regions having the high point defect density which are a part of the body region 32. However, as shown in FIG. 11, the low lifetime regions 33 may be constituted of p-type regions having a higher p-type impurity density than the body region 32. The p-type impurities provided at lattice sites are one type of the point defects. Thus, in the regions having the high p-type impurity density, the point defect density is high and the carrier lifetime is short. For example, p-type regions having the p-type impurity density which is greater than $1 \times 10^{-18}$ cm$^3$ may be used as the low lifetime regions 33. Due to this, even if the low lifetime regions 33 are constituted of the p-type regions having the high p-type impurity density as in FIG. 11, the growth of the plane defects can be suppressed similarly to the aforementioned embodiment. By constituting the low lifetime regions 33 of the p-type regions having the higher p-type impurity density than the body region 32, a so-called punch through phenomenon, in which a depletion layer which spreads from the drift region 34 to the body region 32 reaches the source region 30 upon when the MOSFET is turned off can be suppressed.

Figure 12:
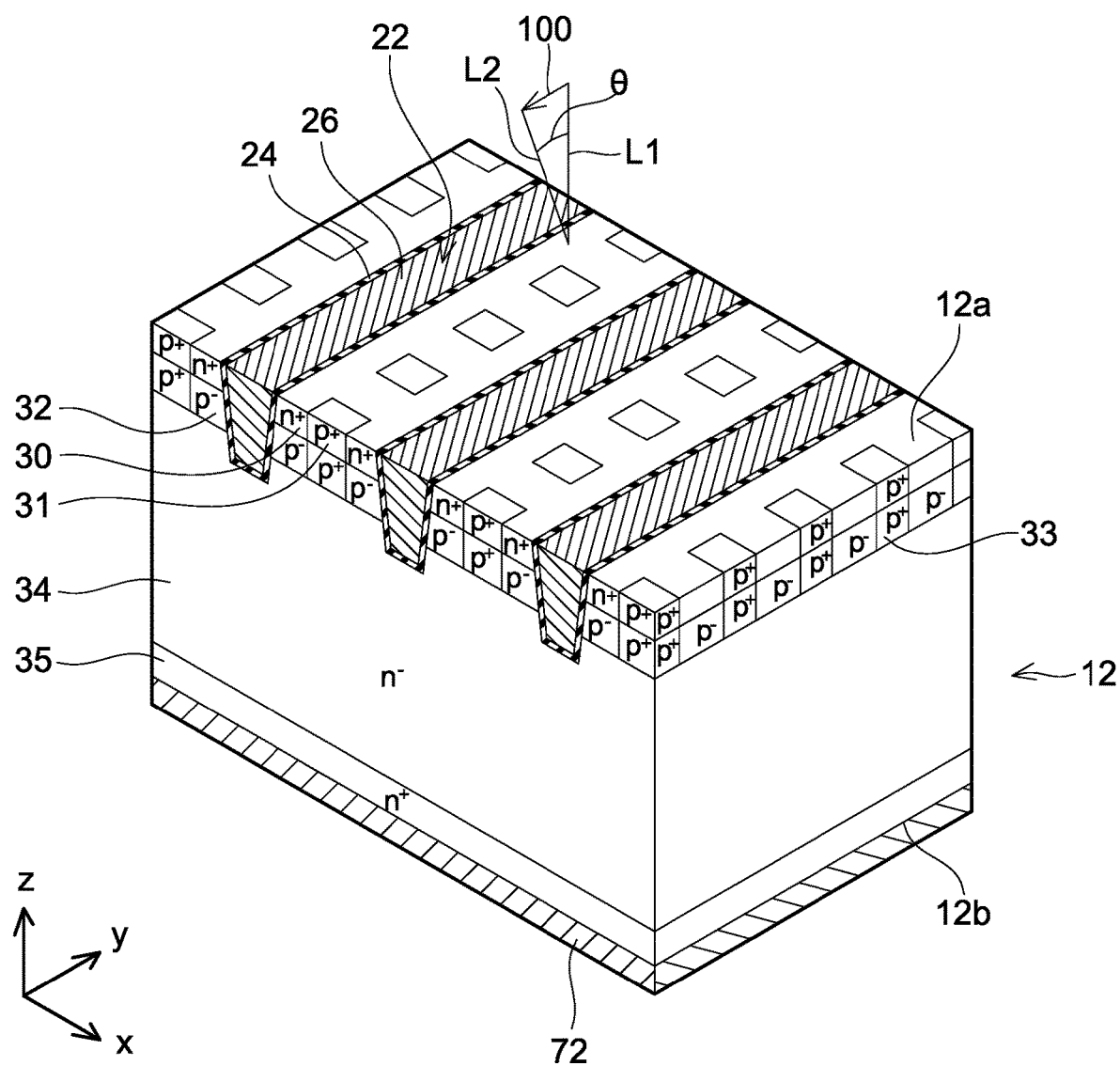
FIG. 12 is a diagram showing an example of the arrangement of the low lifetime regions.

Further, in the case where the low lifetime regions 33 are constituted of the p-type regions having the higher p-type impurity density than the body region 32, the low lifetime regions 33 may be provided under the contact regions 31 as shown in FIG. 12. In such a configuration, pairs of the contact regions 31 and the low lifetime regions 33 constitute continuous high-density p-type regions. In this configuration, the body region 32 is connected to the contact regions 31 via the p-type low lifetime regions 33. In this configuration as well, electrons and holes flow through the body region 32 upon the electric conduction of the diode. In this configuration, since the contact regions 31 and the low lifetime regions 33 can be formed by a common ion implanting process, so the switching element can be manufactured efficiently.

Also in the case where the low lifetime regions 33 are constituted of the p-type regions having the higher p-type impurity density than the body region 32, positions and ranges of the low lifetime regions 33 may be changed similarly to FIGS. 6 to 9. In the case where the p-type regions having the higher p-type impurity density are used as the low lifetime regions 33, if the low lifetime regions 33 are configured to be in contact with the gate insulating films 24, no channel is formed in ranges where the low lifetime regions 33 are in contact with the gate insulating films 24. Thus, as shown in FIG. 6, by providing intervals between the low lifetime regions 33 and the gate insulating films 24, ranges in which the channels are to be formed can be broadened, and current density in the channels can be reduced.

Figure 13:
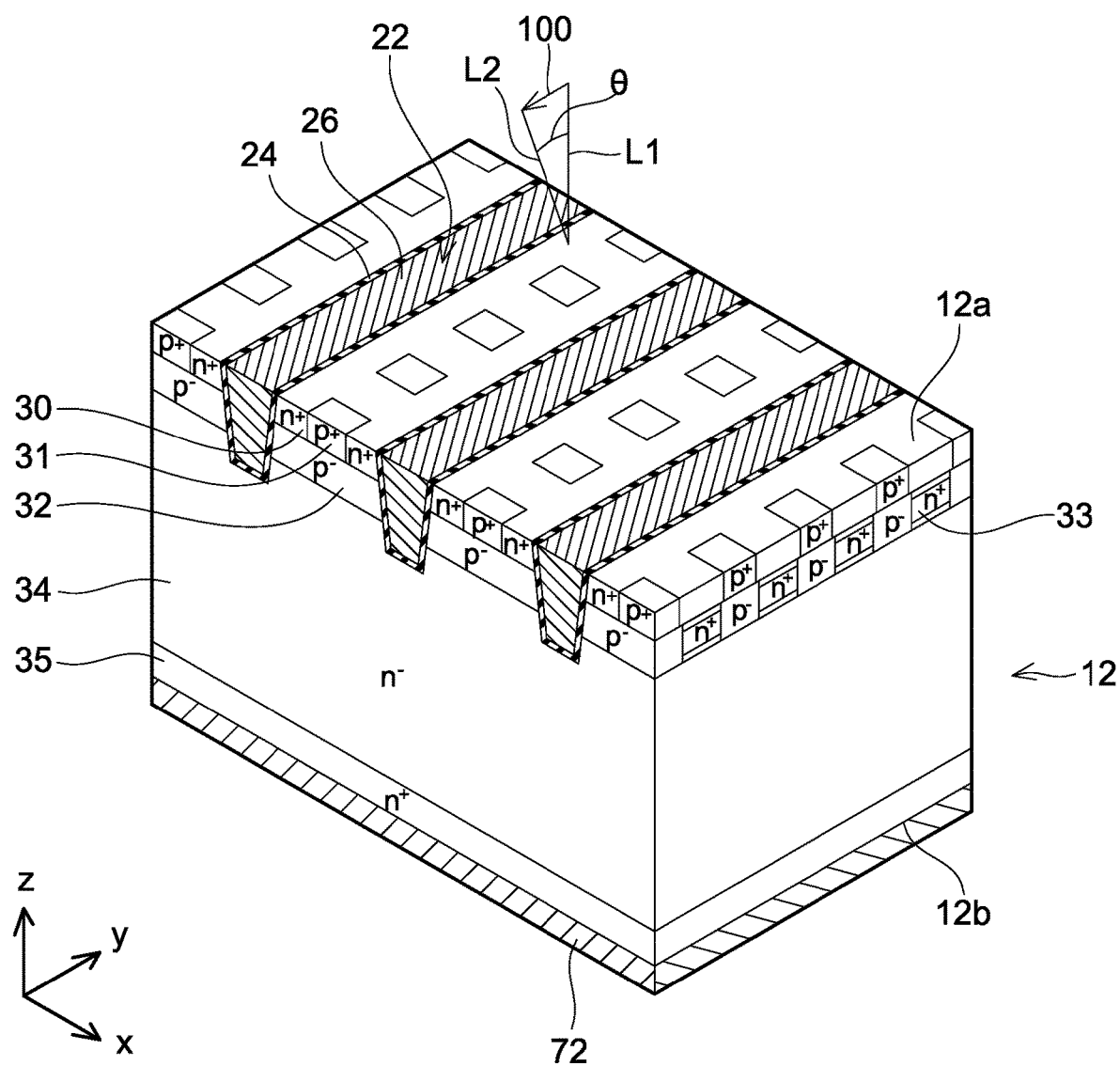
FIG. 13 is a diagram showing the low lifetime regions constituted of high-density n-type regions.

Further, as shown in FIG. 13, the low lifetime regions 33 may be constituted of n-type regions having n-type impurity density which is higher than the p-type impurity density of the body region 32. The n-type impurities provided at the lattice sites are one type of the point defects. Thus, in the regions having the high n-type impurity density, the point defect density is high and the carrier lifetime is short. Due to this, even if the low lifetime regions 33 are constituted of the n-type regions having the high n-type impurity density as in FIG. 13, the growth of the plane defects in the body region 32 can be suppressed.

In the case where the low lifetime regions 33 are constituted of the n-type regions having the high n-type impurity density, the source region 30 and the drift region 34 are short-circuited when the low lifetime regions 33 are connected to the source region 30 and the drift region 34. Thus, the low lifetime regions 33 need to be arranged at positions where the source region 30 and the drift region 34 would not be short-circuited. The positions and ranges of the low lifetime regions 33 can suitably be changed so long as the source region 30 and the drift region 34 are not short-circuited. For example, the arrangements shown in FIGS. 6 to 9 may be applied to the low lifetime regions 33 constituted of the n-type regions such that the source region 30 and the drift region 34 would not be short-circuited.

Some of the features characteristic to technical elements disclosed herein will be listed below. It should be noted that the respective technical elements are independent of one another, and are useful solely or in combinations.

In an example of the switching element disclosed herein, each of the low lifetime regions may be constituted of a part of the body region.

Further, in another example of the switching element disclosed herein, each of the low lifetime regions may be a p-type region having a p-type impurity density higher than the p-type impurity density of the body region.

Further, in yet another example of the switching element disclosed herein, each of the low lifetime regions may be an n-type region having an n-type impurity density higher than the p-type impurity density of the body region.

According to any of these configurations, the growth of the plane defects can be suppressed by the low lifetime regions.

In an example of the switching element disclosed herein, a width w of each of the intervals along the off-direction, a thickness h of each of the low lifetime regions, and the off-angle θ may satisfy a relationship w<h/tan θ.

According to this configuration, the plane defects growing from the upper end of the body region in the intervals reach the low lifetime regions. The plane defects can be effectively prevented from reaching the drift region.

In an example of the switching element disclosed herein, each of the low lifetime regions may be separated from the gate insulating film.

According to this configuration, the current density in the channels in the switching element can be reduced.

In an example of the switching element disclosed herein, each of the low lifetime regions may extend to a lower end of the contact region.

According to this configuration, the plane defects can more easily reach the low lifetime regions.

In an example of the switching element disclosed herein, a lower end of each of the low lifetime regions may be located above a lower end of the body region.

According to this configuration, the electric field accumulation at the lower ends of the low lifetime regions can be suppressed.

In an example of the switching element disclosed herein, each of the low lifetime regions may extend from a position under the source region to a position under the contact region.

According to this configuration, the growth of the plane defects can be suppressed over a wide area.

In an example of the method of manufacturing the switching element disclosed herein, the method may comprise implanting charged particles into a part of the body region so as to form the low lifetime regions, the charged particles not being p-type impurities nor n-type impurities.

According to this configuration, the low lifetime regions can be formed without changing the impurity density of an implantation area.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A switching element, comprising:
   a SiC substrate including an off-angle;
   a trench provided in an upper surface of the SiC substrate and extending along an off-direction of the SiC substrate in a plan view of the upper surface;
   a gate insulating film covering an inner surface of the trench; and
   a gate electrode provided in the trench and insulated from the SiC substrate by the gate insulating film,
   wherein
   the SiC substrate comprises:
      a source region of n-type disposed at the upper surface and being in contact with the gate insulating film;
      a contact region of p-type disposed at the upper surface at a position adjacent to the source region;
      a body region of p-type being in contact with the gate insulating film below the source region, connected to the contact region directly or via another p-type region, and having a p-type impurity density lower than a p-type impurity density of the contact region;
      a drift region of n-type being in contact with the gate insulating film below the body region; and
      a plurality of low lifetime regions located in a range between the drift region and at least one of the source region and the contact region, and having a point defect density higher than a point defect density in portions of the body region around the low life time regions,
   the low lifetime regions are arranged along the off-direction with intervals, and
   at least a part of the body region is provided in the intervals.

2. The switching element of claim 1, wherein each of the low lifetime regions is constituted of a part of the body region.

3. A method of manufacturing the switching element of claim 2, the method comprising implanting charged particles into a part of the body region so as to form the low lifetime regions, the charged particles not being p-type impurities nor n-type impurities.

4. The switching element of claim 1, wherein each of the low lifetime regions is a p-type region having a p-type impurity density higher than the p-type impurity density of the body region.

5. The switching element of claim 1, wherein each of the low lifetime regions is an n-type region having an n-type impurity density higher than the p-type impurity density of the body region.

6. The switching element of claim 1, wherein a width w of each of the intervals along the off-direction, a thickness h of each of the low lifetime regions, and the off-angle θ satisfy a relationship w<h/tan θ.

7. The switching element of claim 1, wherein each of the low lifetime regions is separated from the gate insulating film.

8. The switching element of claim 1, wherein each of the low lifetime regions extends to a lower end of the contact region.

9. The switching element of claim 1, wherein a lower end of each of the low lifetime regions is located above a lower end of the body region.

10. The switching element of claim 1, wherein each of the low lifetime regions extends from a position under the source region to a position under the contact region.

* * * * *